United States Patent [19]

Gillum et al.

[11] 4,210,223

[45] Jul. 1, 1980

[54] LOW FREQUENCY FOLDED EXPONENTIAL HORN LOUDSPEAKER APPARATUS WITH BIFURCATED SOUND PATH

[75] Inventors: Gary C. Gillum; Paul W. Klipsch, both of Hope, Ark.

[73] Assignee: Klipsch and Associates, Inc., Hope, Ark.

[21] Appl. No.: 872,256

[22] Filed: Jan. 25, 1978

[51] Int. Cl.[2] .................... H05K 5/00

[52] U.S. Cl. .................... 181/152; 181/156; 181/159; 181/187; 181/194; 181/199

[58] Field of Search .................... 181/152-156, 181/148, 159, 199, 185, 187, 194; 179/1 E, 115.5 H

[56] References Cited

U.S. PATENT DOCUMENTS

| | | | |
|---|---|---|---|
| Re. 18,751 | 2/1933 | Weinberger et al. | 181/151 |
| 1,843,524 | 2/1932 | Stenger | 181/159 |
| 2,194,070 | 3/1940 | Giannini | 181/159 |
| 2,537,141 | 1/1951 | Klipsch | 181/187 |
| 3,108,653 | 10/1963 | Valldeperas | 181/150 |
| 3,536,158 | 10/1970 | Blair | 181/159 |
| 3,642,091 | 2/1972 | Noharo et al. | 181/152 |

FOREIGN PATENT DOCUMENTS

| | | | |
|---|---|---|---|
| 89606 | 12/1960 | Denmark | 181/152 |
| 342369 | 2/1931 | United Kingdom | 181/152 |
| 703199 | 1/1954 | United Kingdom | 181/156 |

OTHER PUBLICATIONS

"A Compound Horn Loudspeaker" by Olson and Massa, Jour. Acous. Soc. Am., vol. 8, No. 1, 1936, pp. 48-52.

"A Study of Theatre Loud Speakers and the Resultant Development of the Shearer Two-Way Horn System" by Hilliard, Teckn. Bul. Acad. Res. Conv., Mar. 1936, pp. 1-15.

"La Scala" by Klipsch, Audio Engineering Society Preprint No. 372, Apr. 1965.

"Audio Perspective—Loud Speakers and Microphones" by Wente and Thuras, trans. AIEE, Jan. 1934, pp. 17-24.

"Means for Radiating Large Amounts of Low Frequency Sound" by Kellogg, Jour. Acoust. Soc. Am., Jul. 1931, pp. 94-111.

"A Low Frequency Horn of Small Dimensions" by Klipsch, Jour. Acous. Soc. Am., vol. 13, No. 2, 1941, pp. 137-144.

"Elements of Acoustical Engineering" by Olson, 1947, pp. 206-209.

*Primary Examiner*—L. T. Hix

*Assistant Examiner*—Benjamin R. Fuller

*Attorney, Agent, or Firm*—Wood, Herron & Evans

[57] ABSTRACT

A low frequency loudspeaker apparatus includes a folded exponential horn which is divided to provide a bifurcated curved sound path from at least one electroacoustic transducer that is positioned at the throat of the horn to a volume into which sound waves are radiated that is located at the bifurcated mouth of the horn. The mean length of the folded exponential horn is such that, at an exponential rate of expansion between the throat and the bifurcated mouth, the area of the mouth is adequate for reproduction of low frequencies in the audible range. An illustrative embodiment of the low frequency loudspeaker apparatus has an effective low end cut-off frequency of 38 Hz. and affords 99 dB SPL output at three meters with one watt input which corresponds to about 20% efficiency measured in free space. Presence of a single boundary surface, such as a stage floor adjacent the mouth of the folded exponential horn, improves amplitude response by 3 to 6 dB.

19 Claims, 6 Drawing Figures

LOW FREQUENCY FOLDED EXPONENTIAL HORN LOUDSPEAKER APPARATUS WITH BIFURCATED SOUND PATH

BACKGROUND OF THE INVENTION

This invention relates to an electroacoustic apparatus and, more particularly, to a loudspeaker apparatus for reproduction of low frequencies in the audible range. Specifically, this invention relates at a low frequency folded exponential horn loudspeaker apparatus which has a bifurcated sound path for direction of sound waves from at least one electroacoustic transducer to a volume into which the sound waves are radiated.

High fidelity sound reproduction requires reproduction of low frequencies in the audible range. W. B. Snow, "Audible Frequency Ranges of Music, Speech, and Noise", *Jour. Acous. Soc. Am.*, Vol. 3, July, 1931, p. 155, for example, indicates that high fidelity sound reproduction of orchestral music requries that the frequency band should extend to as low as 40 Hz.

It is well established that loudspeakers, in order to reproduce a given frequency range, must have physical dimensions based on the wavelength which corresponds to the lowest frequency in the range. In the case of one type of loudspeaker, the exponential horn type of loudspeaker, for example, the area of the exponential horn mouth is determined based on the wavelength of the lowest frequency in the range to be reproduced.

At an early date, to obtain high fidelity sound reproduction with exponential horn loudspeakers, and, in particular, the inclusion of low frequencies in the audible range, large straight axis exponential horn loudspeakers were constructed. For example, theater loudspeakers as large or larger than eight feet in length and four feet by four feet in transverse physical dimensions were built in order to obtain reproduction of low frequencies in the audible range. More recently, the physical dimensions of exponential horn loudspeakers have been reduced by folding the exponential horn. See, for example, H. F. Olson, Elements of Acoustical Engineering, 1947, pp. 206–209; P. W. Klipsch, "La Scala", Audio Engineering Society Preprint No. 372, April, 1965; H. F. Olson and F. Massa, *Jour. Acous. Soc. Am.*, Vol. 8, No. 1, 1936, pp. 48–52; E. C. Wente and A. L. Thuras, *Jour. A. I. E. E.*, Vol. 53, No. 1, 1934, pp. 17–24; J. K. Hilliard, *Tech. Bul. Acad. Res. Conv., March,* 1936, pp. 1–15.

Prior art low frequency folded exponential horn loudspeakers, such as those which are disclosed in the above-cited references, are, nevertheless, bulky and structurally complex due to the structure of the folded exponential horn which defines the sound path from the electroacoustic transducer to the volume into which sound waves are radiated. In this category are the low frequency loudspeakers with folded exponential horns that are divided to provide bifurcated sound paths as disclosed in the above-cited H. F. Olson, P. W. Klipsch and J. K. Hilliard references.

Specifically, each of these references discloses a structurally complex low frequency loudspeaker that includes a complicated baffle arrangement to form the folded exponential horn which defines the bifurcated sound path. Each of the H. F. Olson and J. K. Hilliard references discloses a doubly folded exponential horn which defines the bifurcated sound path so as to first direct sound waves toward the front, then toward the rear and then again toward the front of the low frequency loudspeaker. Consequently, the bifurcated sound path is a complex serpentine sound path. Each of the J. K. Hilliard and P. W. Klipsch references discloses a folded exponential horn which defines the bifurcated sound path wherein the folded exponential horn includes a pyramid- or cone-shape baffle that must occupy a precise position with respect to the throat so as to make construction difficult. Moreover, the P. W. Klipsch reference discloses a structurally complex low frequency loudspeaker that includes a centrally located electroacoustic transducer and back air chamber arrangement which requires precise orientation since the back air chamber walls also form part of the folded exponential horn which defines the bifurcated sound path.

Although the low frequency loudspeakers that are disclosed in these references afford acceptable sound reproduction characteristics at low frequencies in the audible range, the complex structure has necessitated considerable craftsmanship in construction and close attention to quality control and has resulted in high cost. Furthermore, the physical dimensions and weight of these low frequency loudspeakers due to structural complexity and amount of materials that is incorporated to construct the baffle arrangement has often resulted in a size too large to fit through a standard doorway and too weighty to manually carry.

One objective of this invention is to provide a low frequency loudspeaker apparatus of the folded exponential horn type which does not require the cooperation of independent boundary surfaces adjacent to the mouth to reproduce low frequencies in the audible range.

Another objective of this invention is to provide a low frequency folded exponential horn loudspeaker apparatus for the performing arts for high fidelity sound reproduction.

A further objective of this invention is to provide a low frequency folded exponential horn loudspeaker apparatus capable of generating 20–30 acoustic watts continuous average power.

Another objective of this invention is to provide a low frequency folded exponential horn loudspeaker apparatus which operates at optimum efficiency.

An additional objective of this invention is to provide a loudspeaker apparatus which has a smooth amplitude response over the lower range of audible frequencies that is necessary for high fidelity sound reproduction.

Another objective of this invention is to provide a low frequency folded exponential horn loudspeaker apparatus with a minimum of amplitude and frequency modulation distortion.

A further objective of this invention is to provide a low frequency folded exponential horn loudspeaker apparatus with a simplified structure without sacrificing high fidelity sound reproduction.

Another objective of this invention is to restrict one physical dimension to a maximum of 32 inches to allow passage of the low frequency folded exponential horn loudspeaker apparatus through a standard doorway without sacrificing response at low frequencies in the audible range.

SUMMARY OF THE INVENTION

These and other objectives are achieved in a preferred embodiment of the present invention which provides a simplified structure for a high fidelity, low frequency folded exponential horn loudspeaker apparatus.

The low frequency loudspeaker apparatus has a folded exponential horn which is divided to provide a bifurcated curved sound path from at least one electroacoustic transducer that is positioned at the throat of the horn to a volume of air into which sound waves are radiated that is located at the mouth of the horn. The length of the horn is such that, at an exponential rate of expansion between the throat and the mouth, the effective mouth area is adequate for reproduction of low frequencies in the audible range. A specific example of the low frequency loudspeaker apparatus of the present invention has a low end cut-off frequency below 40 Hz. Advantageously, the low frequency loudspeaker apparatus of the present invention has high acoustic output capacity, efficiency and fulfills the requirement set forth by the W. B. Snow reference. The simplified structure of the folded exponential horn reduces the size and weight so that the low frequency loudspeaker apparatus can be manually transported through a standard doorway. Moreover, this simplified structure facilitates construction so as to lower the cost of production.

The preferred embodiment of the folded exponential horn of the low frequency loudspeaker apparatus of the present invention includes a rear wall having a first side edge, a second side edge, a top edge and a bottom edge. A first side wall having a first side edge, a second side edge, a top edge and a bottom edge has its first edge connected to the first side edge of the rear wall at an obtuse angle. A second side wall having a first side edge, a second side edge, a top edge and a bottom edge has its first side edge connected to the second side edge of the rear wall at an obtuse angle. The respective first and second side walls extend obtusely and forwardly away from the rear wall such that the respective second side edges of the first and second side walls lie in a frontal plane.

A central wall having a first side edge, a second side edge, a top edge and a bottom edge lies in the frontal plane between the first and second side walls. A first interior wall having a first side edge, a second side edge, a top edge and a bottom edge has its first side edge connected perpendicularly to the first side edge of the central wall. A second interior wall having a first side edge, a second side edge, a top edge and a bottom edge has its first side edge connected perpendicularly to the second side edge of the central wall. The first and second interior walls extend perpendicularly and rearwardly away from the central walls such that the respective second side edges of the first and second interior walls lie in an intermediate plane spaced forwardly from the rear wall.

A driver board having a first side edge, a second side edge, a top edge and a bottom edge has its first side edge connected perpendicularly to the first interior wall and has its second side edge connected perpendicularly to the second interior wall in a plane between the frontal plane and the intermediate plane. The driver board includes at least one aperture proximate the diaphragm of at least one low frequency electroacoustic transducer. Preferably, the driver board has two apertures, and each aperture is proximate the diaphragm of one of two low frequency electroacoustic transducers so as to provide a low frequency loudspeaker apparatus capable of generating 20–30 acoustic watts continuous average power. Each aperture has a first side edge, a second side edge, a top edge and a bottom edge.

A first divergent wall having a first side edge, a second side edge, a top edge and a bottom edge has its first side edge connected at an obtuse angle to the driver board at the first side edge of the at least one aperture. The first divergent wall extends rearwardly such that its second side edge intersects the second side edge of the first interior wall at the intermediate plane. A second divergent wall having a first side edge, a second side edge, a top edge and a bottom edge has its first side edge connected at an obtuse angle to the driver board at the second side edge of the at least one aperture. The second divergent wall extends rearwardly such that its second side edge intersects the second side edge of the second interior wall at the intermediate plane.

A top wall is connected to the respective top edges of the rear wall, the first and second side walls, the central wall, the first and second interior walls, the driver board and the first and second divergent walls. A bottom wall is connected to the respective bottom edges of the rear wall, the first and second side walls, the central wall, the first and second interior walls, the driver board and the first and second divergent walls.

The diaphragm of the at least one low frequency electroacoustic transducer is acoustically coupled by the at least one aperture, or throat, to a bifurcated mouth between the respective second side edges of the first and second side walls and the central wall through a folded exponential horn. The folded exponential horn is defined intially by the top and bottom walls and by the first and second divergent walls. The folded exponential horn is bifurcated at the intermediate plane and is thereafter defined by the top and bottom walls and by the rear wall and the first side wall and the first interior wall, which form one branch, and by the second side wall and the second interior wall, which form the second branch.

The two openings of the bifurcated mouth are separated by the central walls such that the central wall defines an island boundary surface. This island boundary surface increases the effective mouth area of the bifurcated mouth so as to enable a reduced area for the two openings without raising the low end cut-off frequency of the low frequency loudspeaker apparatus. The effective mouth area is, therefore, increased by the integral structure of the low frequency loudspeaker apparatus, and, consequently, it is not necessary to place the low frequency loudspeaker apparatus adjacent to independent boundary surfaces, such as the walls of a room, in order to reproduce low frequencies in the audible range.

Preferably, a septum is included between the top and bottom walls to serve as a brace to render the low frequency loudspeaker apparatus structurally rigid so as to minimize modulation distortion and also to minimize amplitude response variations.

A back air chamber for the at least one electroacoustic transducer includes not only a first back air chamber region defined by the space between the central wall, the first and second interior walls and the driver board in which the at least one electroacoustic transducer is immersed but, also, second back air chamber regions defined by the space between the first interior wall and the first divergent wall, on the one hand, and the space between the second interior wall and the second divergent wall, as well. The corners and middle portions of the driver board are preferably relieved by cutouts so that the first back air chamber region communicates with the second back air chamber regions through the cutouts. This reduces the volume needed for the first back air chamber region and enables the at least one electroacoustic transducer to be positioned more forwardly in the low frequency loudspeaker apparatus so that the length of the exponential horn is effectively increased without increasing the physical dimensions of the low frequency loudspeaker apparatus, which results in a decreased low end cut-off frequency.

Preferably, braces are provided in both the first and second back air chamber regions so that the back air chamber is substantially rigid. This also serves to minimize modulation distortion and amplitude response variations.

Furthermore, the rear wall, the side walls, the interior walls and the divergent walls preferably have flat surfaces rather than true exponentially curved surfaces. This facilitates construction and lowers production cost without sacrificing high fidelity sound reproduction.

BRIEF DESCRIPTION OF THE DRAWING

The present invention will be better understood and the advantages of the present invention will become clear to those of skill in the art by reference to the drawing accompanied by the description which appears below relative to a preferred embodiment. In the drawing:

With reference to FIG. 1, a preferred embodiment for a low frequency loudspeaker apparatus, which is designated generally by the numeral 10, of the present invention is shown. As shown in FIGS. 3 and 4, the low frequency loudspeaker apparatus 10 includes at least one low frequency electroacoustic transducer 11 which includes an electromagnet 12 that is responsive to an externally applied electrical signal to vibrate a diaphragm 13. The electroacoustic transducer 11 vibrates air such that the electrical signal is converted to an acoustic signal, or sound waves. The magnitude of vibration of the diaphragm 13 by the electromagnet 12 at a particular frequency is proportional to the amplitude of the component at that frequency in the electrical signal. The electroacoustic transducer 11 is conventional in design and may be, for example, a KLIPSCH K43 cone-type diaphragm electroacoustic transducer available through Klipsch and Associates, Inc., Hope, Arkansas.

In order to provide a capability of generating at least 20–30 acoustic watts continuous average power, another low frequency electroacoustic transducer 14, which includes an electromagnet 15 that is responsive to the same externally applied electrical signal to vibrate a diaphragm 16, is preferably included. For the purpose of high fidelity sound reproduction, preferably the electroacoustic transducers 11 and 14 have identical characteristics of operation, and, therefore, the electroacoustic transducer 14 may also be, for example, a KLIPSCH K43 cone-type diaphragm electroacoustic transducer.

Figure 3:
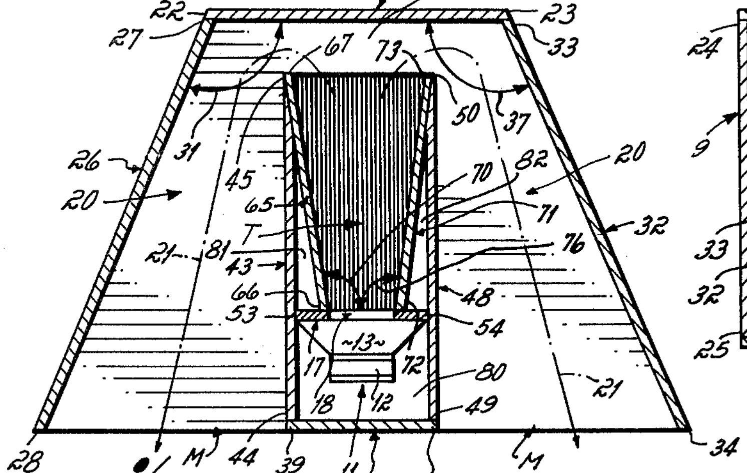
FIG. 3 is a cross-sectional view of the low frequency loudspeaker apparatus taken along line 3—3 in FIG. 2.
Figure 4:
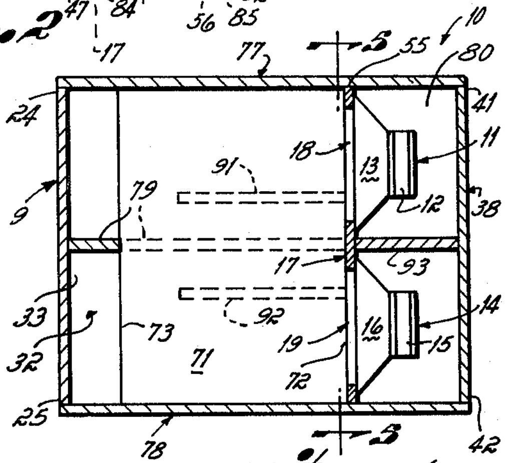
FIG. 4 is a cross-sectional view of the low frequency loudspeaker apparatus taken along line 4—4 in FIG. 2.
Figure 5:
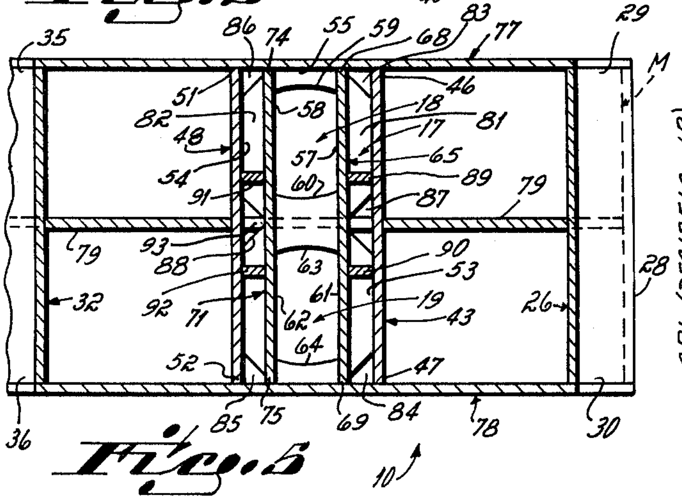
FIG. 5 is a cross-sectional view of the low frequency loudspeaker apparatus taken along line 5—5 in FIG. 4.

The at least one electroacoustic transducer 11 is mounted on a driver board 17 which includes at least one aperture 18. As shown in FIGS. 3 and 4 wherein two electroacoustic transducers 11 and 14 are included, each of the electroacoustic transducers 11 and 14 is secured, for example, by means of screws (not shown) to the driver board 17 which includes apertures 18 and 19 for the respective electroacoustic transducers 11 and 14.

The at least one aperture 18 forms the throat T of a folded exponential horn 20 when only one electroacoustic transducer 11 is included. When electroacoustic transducers 11 and 14 are included as shown in FIG. 4, the apertures 18 and 19 combine to form the throat T of the exponential horn 20.

The exponential horn 20 is bifurcated as shown most clearly in FIG. 3. The folded exponential horn 20 defines a bifurcated curved sound path, which is indicated by the dashed lines 21 in FIG. 3, to interconnect the throat T of the exponential horn 20 to the bifurcated mouth M of the exponential horn 20. The bifurcated mouth M provides an opening into a volume of air such as a room, auditorium, theater, ampitheater, indoor or outdoor stage, etc.

When an electrical signal is applied to the electromagnets 12 and 15 form an external source, the respective diaphragms 13 and 16 are vibrated so as to convert the electrical signal into an acoustic signal, or sound waves, which propagate through the throat T, along the bifurcated curved sound path 21 and through the bifurcated mouth M into the volume of air. Hence, a listener who is positioned within the volume of air hears the acoustic signal.

With reference to FIGS. 2–5, the structure of the exponential horn 20 will now be described in detail. The preferred embodiment of the exponential horn 20 of the low frequency loudspeaker apparatus 10 of the present invention includes a rear wall 9 having a first side edge 22, a second side edge 23, a top edge 24 and a bottom edge 25. A first side wall 26 having a first side edge 27, a second side edge 28, a top edge 29 and a bottom edge 30 has its first side edge 27 connected to the first side edge 22 of the rear wall 9 at an obtuse angle 31. A second side wall 32 having a first side edge 33, a second side edge 34, a top edge 35 and a bottom edge 36 has its first side edge 33 connected to the second side edge 23 of the rear wall 9 at an obtuse angle 37. The respective side walls 26 and 32 extend obtusely and forwardly away from the rear wall 9 such that the second side edges 28 and 34 of the respective side walls 26 and 32 lie in a frontal plane in which the bifurcated mouth M lies as shown in FIG. 3.

A central wall 38 having a first side edge 39, a second side edge 40, a top edge 41 and a bottom edge 42 lies in the frontal plane between the side walls 26 and 32. A first interior wall 43 having a first side edge 44, a second side edge 45, a top edge 46 and a bottom edge 47 has its first side edge 44 connected perpendicularly to the first side edge 39 of the central wall 38. A second interior wall 48 having a first side edge 49, a second side edge 50, a top edge 51 and a bottom edge 52 has its first side edge 49 connected perpendicularly to the second side edge 40 of the central wall 38. The interior walls 43 and 48 extend perpendicularly and rearwardly away from the central wall 38 such that the second side edges 45 and 50 of the respective interior walls 43 and 48 lie in an intermediate plane spaced forwardly from the rear wall 9.

The driver board 17 having a first side edge 53, a second side edge 54, a top edge 55 and a bottom edge 56 has its first side edge 53 connected perpendicularly to the first interior wall 43 and has its second side edge 54 connected perpendicularly to the interior wall 48 in a plane between the frontal and intermediate planes.

The driver board 17 includes the at least one aperture 18 and, preferably, the driver board 17 has two apertures 18 and 19. The aperture 18 has a first side edge 57, a second side edge 58, a top edge 59 and a bottom edge 60. The aperture 19 has a first side edge 61, a second side edge 62, a top edge 63 and a bottom edge 64.

A first divergent wall 65 having a first side edge 66, a second side edge 67, a top edge 68 and a bottom edge 69 has its first side edge 66 connected at an obtuse angle 70 to the driver board 17 at the first side edges 57 and 61 of the respective apertures 18 and 19. The first divergent wall extends rearwardly such that its second side edge 67 intersects the second side edge 45 of the first interior wall 43 at the intermediate plane. A second divergent wall 71 having a first side edge 72, a second side edge 73, a top edge 74 and a bottom edge 75 has its first side edge 72 connected to an obtuse angle 76 to the driver board 17 at the second side edges 58 and 62 of the respective apertures 18 and 19. The second divergent wall extends rearwardly such that its second side edge 73 intersects the second side edge 50 of the second interior wall 48 at the intermediate plane.

A top wall 77 is connected to the top edges 24, 29, 35, 41, 46, 51, 55, 68 and 74 of the rear wall 9, the side walls 26 and 32, the central wall 38, the interior walls 43 and 48, the driver board 17 and the divergent walls 65 and 71, respectively. A bottom wall 78 is connected to the bottom edges 25, 30, 36, 42, 47, 52, 56, 69 and 75 of the rear wall 9, the side walls 26 and 32, the central wall 38, the interior walls 43 and 48, the driver board 17 and the divergent walls 65 and 71, respectively.

The diaphragms 13 and 16 of the electroacoustic transducers 11 and 14 are acoustically coupled by the apertures 18 and 19, which form the throat T, to the bifurcated mouth M between the respective second side edges 28 and 34 of the side walls 26 and 32 and the central wall 38 through the exponential horn 20, that is defined initially by the top and bottom walls 77 and 78 and the divergent walls 65 and 71 and is bifurcated at the intermediate plane and is thereafter defined by (a) the top and bottom walls 77 and 78, the rear wall 9, the first side wall 26 and the first interior wall 43, on the one hand, and by (b) the top and bottom walls 77 and 78, the rear wall 9, the second side wall 32 and second interior wall 48, on the other hand.

Preferably, a septum 79 is included between the top and bottom walls 77 and 78 to serve as a brace to render the low frequency loudspeaker apparatus 10 structurally rigid so as to minimize modulation distortion and amplitude responsive variations.

Figure 6:
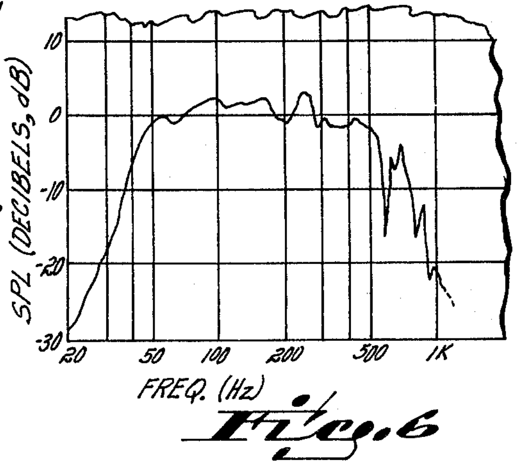
FIG. 6 is a performance curve, which shows the amplitude response at various frequencies, for a specific example of a preferred embodiment of the present invention.

The structure of the exponential horn 20 preferably has elements which have flat surfaces that approximate exponentially curved surfaces rather than surfaces which are curved in accordance with the exponential function. It has been found that the use of elements which have flat surfaces in a low frequency loudspeaker apparatus of the exponential horn type does not greatly detract from high fidelity reproduction of low frequencies in the audible range. The use of such elements, rather than exponentially curved elements, is demonstrated by H. F. Olson and F. Massa, "A Compound Horn Loudspeaker", *Jour. Acous. Soc. Am.*, July, 1936, pp. 48–52, wherein FIG. 6 shows horns constructed with true exponentially curved surfaces and horns constructed with flat surfaces that approximate exponentially curved surfaces. These authors state that tests demonstrate very little difference for operation at audible frequencies below 300 Hz. The use of elements which have flat surfaces instead of exponentially curved surfaces in the preferred embodiment of the present invention facilitates construction of the exponential horn 20 and lowers production cost. The present invention, however, also contemplates construction by elements with exponentially curved surfaces.

With reference to FIGS. 3 and 4, the low frequency loudspeaker apparatus also includes a back air chamber. The back air chamber has two purposes: (1) to neutralize the inductive reactance of the throat impedance of the exponential horn 20 in the low frequency pass band and (2) to act as an element of a high pass filter which is effective in the lower cut-off region to increase the reactive load on the diaphragms 13 and 16 to limit unwanted vibration which would otherwise cause modulation distortion. The back air chamber must be substantially airtight. Otherwise, the back air chamber will appear as a combination of acoustic resistance and inductive reactance instead of pure acoustic capacitive reactance as desired when the electroacoustic transducers 11 and 14 are operative in the low frequency pass band.

The back air chamber for the electroacoustic transducers 11 and 14 includes not only a first back air chamber region 80 defined by the space between the central wall 38, the first and second interior walls 43 and 48 and the driver board 17 in which the electroacoustic transducers 11 and 14 are immersed but, also, second back air chamber regions 81 and 82 defined by the space between the first interior wall 43 and the first divergent wall 65 and the space between the second interior wall 48 and the second divergent wall 71 as well.

Figure 2:
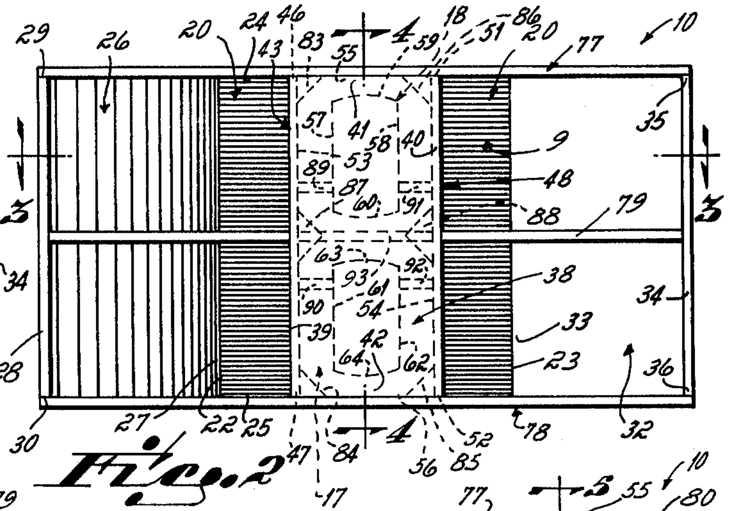
FIG. 2 is a front elevational view of the low frequency loudspeaker apparatus of FIG. 1.

As best shown in FIG. 2, the corners 83, 84, 85 and 86 and middle portions 87 and 88 of the driver board 17 are preferably relieved by cutouts so that the first back air chamber region 80 communicates with the second back air chamber regions 81 and 82. This reduces the size of the first back air chamber region 80 and enables the electroacoustic transducers 11 and 14 to be positioned more forwardly in the low frequency loudspeaker apparatus 10 so that the length of the exponential horn 20 is effectively increased, thereby reducing the overall size of the low frequency loudspeaker apparatus 10.

Preferably, braces 89, 90, 91, 92 and 93 are provided in the first and second back air chamber regions 80, 81 and 82 so that the back air chamber is substantially rigid. This also serves to minimize modulation distortion and amplitude response variations.

In summary, the low frequency loudspeaker apparatus of the present invention includes at least one electroacoustic transducer with a substantially airtight back air chamber. The low frequncy loudspeaker apparatus further includes a folded exponential horn which is preferably constructed with elements which have flat surfaces that approximate exponentially curved surfaces to facilitate construction. The low frequency loudspeaker apparatus has relatively small dimensions since the folded exponential horn is divided to provide a bifurcated curved sound path which extends from the at least one electroacoustic transducer at the throat T to the volume into which sound waves are radiated at the bifurcated mouth M.

A specific example of a low frequency loudspeaker apparatus in accordance with the preferred embodiment of the present invention will now be described for radiation of sound waves preferably into a $2\pi$ solid angle, or hemisphere, although radiation of sound waves into a $4\pi$ solid angle, or universe, is contemplated. Since the W. B. Snow reference indicates that faithful reproduction of orchestral music requires that the frequency band should extend to as low as 40 Hz., a specific example will be given for a low frequency loudspeaker apparatus which has a low end cut-off frequency below 40 Hz.

Selection of the electroacoustic transducers 11 and 14 is based primarily on the desired power capacity of 20-30 acoustic watts continuous average power and the frequency response in the desired frequency range of from below 40 Hz., so as to include low frequencies for high fidelity reproduction of orchestral music based on the W. B. Snow criterion, to approximately 500 Hz., so as not to significantly exceed the frequency at which the exponential horn can no longer be constructed by elements which have flat surfaces that are approximations to exponentially curved surfaces based on the aforementioned H. F. Olson and F. Massa criterion. Accordingly, KLIPSCH K43 cone-type diaphragm electroacoustic transducers may be used for the electroacoustic transducers 11 and 14.

Once the electroacoustic trandsucers 11 and 14 have been selected, the characteristics of the selected electroacoustic transducer which are published by the manufacturer can be used to determine the area for the throat T of the exponential horn 20 in accordance with the equations in E. C. Wente and A. L. Thuras, "Auditory Perspective-Loud Speakers and Microphones", *Trans. A. I. E. E.*, January, 1934, pp. 19-20. The throat area thus determined provides maximum power transfer, or efficiency, for the selected electroacoustic transducer. For each KLIPSCH K43, a throat area must be provided of approximately 86 square inches, or 555 square centimeters.

ELEMENTS OF THE DESIGN

Cut-off frequency, $f_o$, equals $c/\lambda_o$, where c is equal to the velocity of sound (344 meters a second, or 13,500 inches a second). The length within which the horn area doubles, designated by the Hebrew letter Llamed, $\epsilon$, equals $\lambda o/18.1$.

A cut-off frequency, $f_o$, of 32 Hz. was chosen. Therefore, $\lambda o$ equals 13,500/32 which equals 422 inches, or 1072 centimeters, and $\epsilon$ equals 422/18.1 which equals 23.3 inches, or 59.2 centimeters.

The total throat area, $A_T$, equals 172 square inches, or 1110 square centimeters. A mouth area, $A_M$, of 1,472.6 square inches, or 9500.7 square centimeters was chosen. Consequently, $A_M/A_T=8.56=2^{3.1}$ which means that the horn area doubles 3.1 times, or the mean sound path length 21 equals, 3.1 $\epsilon$, or $3.1\times23.3$, which equals 72.2 inches, or 183.5 centimeters.

Based on the work of E. W. Kellogg, "Means for Radiating Large Amounts of Low Frequency Sound", *Jour. Acous. Soc. Am.*, July, 1931 p. 105, as well as the E. C. Wente and A. L. Thuras reference and experience with the KLIPSCHORN loudspeaker, one can tabulate the mouth size needed for radiation into various solid angles.

| | MOUTH SIZE $\sqrt{A_M}$ | | | |
|---|---|---|---|---|
| | SOLID ANGLE | | | |
| AUTHOR(S) | $4\pi$ | $2\pi$ | $\pi$ | $\pi/2$ |
| E. W. Kellogg | $\lambda_o/2.2$ | $\lambda_o/3.3$ | | |
| E. C. Wente and A. L. Thuras | | $\lambda_o/6.6$* | | |
| P. W. Klipsch | | | $\lambda_o/6$ | $\lambda_o/12$ |

*For Properly Selected Electroacoustic Transducer

If the subject loudspeaker is to be operated in a trihedral corner ($\pi/2$ solid angle), the mouth size $\sqrt{A_M}$ equals $\lambda o/12$, or 422/12, which equals 35.2 inches, or 89.3 centimeters, which means $A_M$ equals 1,237 square inches, or 7,981 square centimeters. This is close to the chosen 1,472.6 square inches. It should be expected that, for larger radiation angles, the low end cut-off frequency would be higher than $f_o=32$ Hz. Indeed, if a $2\pi$ solid angle were selected, the mouth area would have to be defined $\sqrt{A_M}=\lambda o/6.6$, or more, or somewhere near a half octave of bass would have to be sacrificed.

It should be understood that the actual construction comprised trade off between minimum frequency ($f_o$), a size that would go through a "standard" door, what the practical lowest frequency should be, and other factors.

Figure 1:
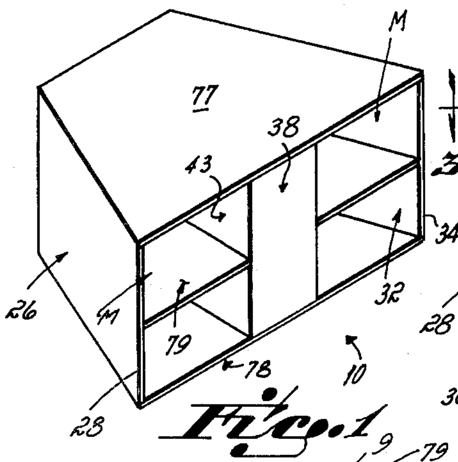
FIG. 1 is an isometric view of a preferred embodiment for a low frequency folded exponential horn loudspeaker apparatus in accordance with the present invention.

As shown in FIGS. 1-3, the bifurcated mouth M is in the form of two rectangular openings. The first rectangular opening is between the second side edge 28 of the first side wall 26, the first side edge 39 of the central wall 38, the top wall 77 and the bottom wall 78. The second rectangular opening is between the second side edge 34 of the second side wall 32, the second side edge 40 of the central wall 38, the top wall 77 and the bottom wall 78. The two openings of the bifurcated mouth M are, therefore, separated by the central wall 38 such that the central wall 38 defines an island boundary surface adjacent the two openings of the bifurcated mouth M. The central wall 38 increases the effective mouth area of the bifurcated mouth M so as to enable a reduced area for the two openings without raising the low end cut-off frequency.

The area of the bifurcated mouth M is 1,472.6 square inches, or 9,500.7 square centimeters. Accordingly, two 29.75 inch by 24.75 inch rectangular openings are provided with a combined 1,472.6 square inch, or 9,500.7 square centimeter, area for the bifurcated mouth M. It should be noted that the 29.75 inch height of the mouth M plus the additional thickness of the top and bottom walls 77 and 78 is preferably less than 32 inches so that the specific example of the preferred embodiment of the present invention can be turned on end and transported through a standard doorway.

The above-cited E. W. Kellogg reference indicates that folds may be made in an exponential horn, that is, the exponential horn may be bent without seriously altering the operation of the exponential horn, provided that the difference between the shortest and longest sound path is less than a half wavelength. Given this criterion and the throat area, mean sound path length and mouth area, the exponential horn 20 of the specific example for the preferred embodiment of the present invention which appears in FIGS. 3 and 4 can be constructed. As pointed out above, to facilitate construction, elements which have flat surfaces that approximate exponentially curved surfaces are used. However, exponentially curved surfaces may be used and would preferably be used in a low frequency loudspeaker apparatus which operates in a range that extends significantly above 300 Hz.

P. W. Klipsch, "A Low Frequency Horn of Small Dimensions", *Jour. Acous. Soc. Am.*, Vol. 13, No. 2, 1941, pp. 137-144, derives the analytical expression for the volume of a back air chamber. Analytically, this volume should be about 10-20% larger to compensate for the compliance of the suspended diaphragms 13 and 16 and for the immersed volume of the electromagnets 12 and 15. Relying on experience which indicates a 20% change in back air chamber volume may produce less than one decibel of response error and that error toward a smaller back air chamber would result in less modulation distortion from subsonic inputs, it was decided to include a back air chamber, which comprises the first back air chamber region 80 and the second back air chamber regions 81 and 82, with a total volume of 11,200 in $^3$, or 183.5 liters.

The values for the various parameters for a specific example of a low frequency loudspeaker in accordance with the preferred embodiment of the present invention are summarized in Table I.

TABLE I

LOW FREQUENCY LOUDSPEAKER DATA

| | | |
|---|---|---|
| Electroacoustic Transducers | = | KLIPSCH K43 |
| Analytical Low End Cut-Off Frequency | = | 32 Hz. |
| Throat Area (Total area for two KLIPSCH K43 electroacoustic transducers) | = | 172 Square Inches |
| Mouth Area (Total area for bifurcated mouth) | = | 1,472.6 Square Inches |
| Rate of Expansion of Horn | = | Cross-Sectional Area Doubles Every 23.3 Inches |
| Mean Sound Path Length | = | 72.2 Inches |
| Volume of Back Air Chamber (Total volume for first and second back air chamber regions) | = | 11,200 Cubic Inches |

In the specific example for the preferred embodiment of the present invention, the angles 31 and 37 in FIG. 3 are approximately 112°. Also, the angles 70 and 76 in FIG. 3 are approximately 101°.

FIG. 6 shows the amplitude response characteristic of the specific example for the preferred embodiment of the present invention. The amplitude response characteristic in FIG. 6 was obtained under free-field conditions (outdoors) with one microphone at a distance of 3 meters.

As shown in FIG. 6, the amplitude response is relatively smooth over the operating range from approximately 40 Hz. to 500 Hz. with a peak-to-trough ratio of less than 10 dB. The specific example for the preferred embodiment of the present invention affords approximately 99 dB SPL output at 3 meters with an input of one watt measured in free space without the aid of reflective boundaries. Presence of a single boundary, such as a stage floor, will increase SPL by 3to 6 dB. With an input capacity of 1,500 peak watts, the low frequency loudspeaker apparatus can produce 114 dB SPL at 30 meters (100 feet) outdoors.

The response curve of FIG. 6 was obtained with the loudspeaker on stilts approximately one meter high, sound axis horizontal (parallel to the ground plane) and a B & K half-inch microphone three meters from the horn mouth. OdB in FIG. 6 corresponds to 100 dB SPL (sound pressure level) reference 0.0002 dyne/cm$^2$.

Having described the invention, we claim:

1. A loudspeaker apparatus for operating in a low frequency range comprising:

a driver board having at least one aperture;

a back air chamber;

at least one electroacoustic transducer means for converting low frequency electrical signals into low frequency acoustic signals, said at least one electroacoustic transducer means being mounted to said driver board and immersed in said back air chamber; and a folded exponential horn comprising structure defining a region, said structure including:

first and second divergent walls, each of said first and second divergent walls connecting to said driver board near said at least one aperture, and extending rearwardly away from said driver board at a first obtuse angle, said divergent walls terminating in an intermediate plane, said at least one aperture forming a throat for said horn;

first and second interior walls, each of said first and second interior walls connecting to said driver board and extending perpendicularly away from said driver board, said first interior wall converging with said first divergent wall and said second interior wall converging with said second divergent wall in said intermediate plane;

a rear wall opposite and spaced rearwardly from said intermediate plane;

first and second side walls, each of said first and second side walls connecting to said rear wall and extending forwardly away from said rear wall at a second obtuse angle, said side walls terminating in a frontal plane, said first side wall spaced opposite said first interior wall, said second side wall spaced opposite said second interior wall;

said divergent walls and interior walls being oriented with respect to said rear wall and side walls such that the distance therebetween increases from said throat at an exponential rate to a bifurcated mouth in said frontal plane;

a top wall connecting to said driver board, divergent walls, interior walls, rear wall and side walls; and a bottom wall connecting to said driver board, divergent walls, interior walls, rear wall and side walls;

said top and bottom walls together with said divergent walls, interior walls, rear wall and side walls connecting said throat and said mouth and defining said region, said region forming a bifurcated sound path.

2. The loudspeaker apparatus in claim 1 wherein said back air chamber includes a first back air chamber region, said electroacoustic transducer means being immersed in said first back air chamber region, and further includes second back air chamber regions between said first divergent wall and said first interior wall and between said second divergent wall and said second interior wall.

3. The loudspeaker apparatus in claim 1 wherein said divergent walls, interior walls, rear wall and side walls have flat surfaces approximating exponentially curved surfaces.

4. The loudspeaker apparatus in claim 1 wherein said driver board has two apertures forming said throat and wherein said at least one electroacoustic transducer means includes two identical cone-type diaphragm electroacoustic transducers.

5. The loudspeaker apparatus in claim 4 wherein said throat has an area of approximately 172 square inches, said mouth has an area of approximately 1,472.6 square inches, the mean length of said sound path is approximately 72.2 inches, the cross-sectional area of said horn doubles approximately every 23.3 inches, and said back air chamber has a volume of approximately 11,200 cubic inches.

6. The loudspeaker apparatus in claim 5 wherein said first obtuse angle is approximately 101° and said second obtuse angle is approximately 112°.

7. The loudspeaker apparatus in claim 1 further comprising a septum connected to said rear wall, side walls and interior walls in a plane between said top wall and said bottom wall.

8. The loudspeaker apparatus in claim 2 wherein said driver board has corners and middle portions, said corners and middle portions being relieved by cutouts, said cutouts connecting said first back air chamber region to said second back air chamber regions.

9. The loudspeaker apparatus in claim 8 further comprising braces in said first and second back air chamber regions.

10. A loudspeaker apparatus for operating in a low frequency range comprising:

a rear wall having a first side edge, a second side edge, a top edge and a bottom edge;

a first side wall having a first side edge, a second side edge, a top edge and a bottom edge, said first side edge of said first side wall connecting to said first side edge of said rear wall, said first side wall extending forwardly away from said rear wall, said second side edge of said first side wall lying in a frontal plane;

a second side wall having a first side edge, a second side edge, a top edge and a bottom edge, said first side edge of said second side wall connecting to said second side edge of said rear wall, said second side wall extending forwardly away from said rear wall, said second side edge of said second side wall lying in said frontal plane;

a central wall having a first side edge, a second side edge, a top edge and a bottom edge lying in said frontal plane between said second side edges of said respective side walls;

a first interior wall having a first side edge, a second side edge, a top edge and a bottom edge, said first side edge of said first interior wall connecting to said first side edge of said central wall, said first interior wall extending rearwardly away from said central wall toward said rear wall, said second side edge of said first interior wall lying in an intermediate plane;

a second interior wall having a first side edge, a second side edge, a top edge and a bottom edge, said first side edge of said second interior wall connecting to said second side edge of said central wall, said second interior wall extending rearwardly away from said central wall toward said rear wall, said second side edge of said second interior wall lying in said intermediate plane;

said intermediate plane lying between said rear wall and said frontal plane;

a driver board having a first side edge, a second side edge, a top edge and a bottom edge, said first side edge of said driver board connecting to said first interior wall and said second side edge of said driver board connecting to said second interior wall in a plane lying between said frontal and intermediate planes;

said driver board having at least one aperture having a first side edge, a second side edge, a top edge and a bottom edge;

a first divergent wall having a first side edge, a second side edge, a top edge and a bottom edge, said first side edge of said first divergent wall connecting to said driver board near said first side edge of said at least one aperture, said first divergent wall extending rearwardly away from said driver board toward said rear wall, said second side edge of said first divergent wall intersecting said second side edge of said first interior wall in said intermediate plane;

a second divergent wall having a first side edge, a second side edge, a top edge and a bottom edge, said first side edge of said second divergent wall connecting to said driver board near said second side edge of said at least one aperture, said second divergent wall extending rearwardly away from said driver board toward said rear wall, said second side edge of said second divergent wall intersecting said second side edge of said second interior wall in said intermediate plane;

a top wall connecting to said top edges of said respective rear wall, side walls, central wall, interior walls, driver board and divergent walls;

a bottom wall connecting to said bottom edges of said respective rear wall, side walls, central wall, interior walls, driver board and divergent walls;

said rear wall, side walls, interior walls, divergent walls, top wall and bottom wall defining a region therebetween expanding at substantially an exponential rate between said driver board and said frontal plane; and at least one electroacoustic transducer means mounted to said driver board for converting low frequency electrical signals into low frequency acoustic signals, said at least one electroacoustic transducer means being acoustically coupled by said at least one aperture to said region.

11. The loudspeaker apparatus in claim 10 wherein said rear wall, side walls, interior walls and divergent walls have flat surfaces approximating exponentially curved surfaces.

12. The loudspeaker apparatus in claim 10 further comprising a septum connected to said rear wall, side walls and interior walls in a plane between said top wall and said bottom wall.

13. The loudspeaker apparatus in claim 10 wherein space enclosed by said central wall, interior walls, driver board, top wall and bottom wall defines a first back air chamber region and wherein space enclosed by said first interior wall, first divergent wall, driver board, top wall and bottom wall and space enclosed by said second interior wall, second divergent wall, driver board, top wall and bottom wall define second back air chamber regions, said at least one electroacoustic transducer means being immersed in said first back air chamber region, and wherein said driver board has corners and middle portions, said corners and middle portions being relieved by cutouts, said cutouts connecting said first back air chamber region to said second back air chamber regions.

14. The loudspeaker apparatus in claim 13 further comprising braces in said first and second back air chamber regions.

15. The loudspeaker apparatus in claim 10 wherein said driver board has two apertures and wherein said at least one electroacoustic transducer means includes two identical cone-type diaphragm electoacoustic transducers.

16. The loudspeaker apparatus in claim 15 wherein said apertures form a throat and wherein the area in said frontal plane between said second side edge of said first side wall, said first side edge of said central wall, said top wall and said bottom wall and the area in said frontal plane between said second side edge of said second side wall, said second side edge of said central wall, said top wall and said bottom wall form a mouth, said throat having an area of approximately 172 square inches, said mouth having an area of approximately 1,472.6 square inches, said region between said throat and mouth having a mean path length of approximately 72.2 inches, the cross-sectional area of said region between said throat and said mouth doubling approximately every 23.3 inches.

17. The loudspeaker apparatus in claim 13 wherein said driver board has two apertures and wherein said at least one electroacoustic transducer means includes two identical cone-type diaphragm electroacoustic transducers, said back air chamber having a volume of approximately 11,200 cubic inches.

18. The loudspeaker apparatus in claim 10 wherein each of said first and second side walls extends forwardly away from said rear wall at an obtuse angle of approximately 112° and wherein each of said first and second divergent walls extends rearwardly away from said driver board toward said rear wall at an obtuse angle of approximately 101°.

19. A loudspeaker apparatus for operating in a low frequency range comprising:

a driver board and walls, including a four-sided, planar central wall, forming a back air chamber;

at least one electroacoustic transducer means for converting low frequency electrical signals into low frequency acoustic signals, said at least one electroacoustic transducer means being mounted to said driver board and immersed in said back air chamber; and a folded exponential horn including walls defining a bifurcated sound path from a throat, through which said at least one electroacoustic transducer means is acoustically coupled to said horn, to a bifurcated mouth, through which said horn is acoustically coupled to a volume of air, said bifurcated mouth lying in a frontal plane and having a first opening separated from a second opening by said central wall;

said central wall forming an island boundary surface lying in said frontal plane between said openings of said bifurcated mouth, said island boundary surface being adjacent to said openings, said island boundary surface increasing the effective area of said bifurcated mouth;

said bifurcated sound path being folded and having a length such that, at an exponential rate of expansion between said throat and said bifurcated mouth, said bifurcated mouth has an effective mouth area adequate for high fidelity sound reproduction to below a preselected low end cut-off frequency.

* * * * *